(12) United States Patent
Min

(10) Patent No.: US 7,687,366 B2
(45) Date of Patent: Mar. 30, 2010

(54) PRE-PATTERNED THIN FILM CAPACITOR AND METHOD FOR EMBEDDING SAME IN A PACKAGE SUBSTRATE

(75) Inventor: Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 11/601,101

(22) Filed: Nov. 17, 2006

(65) Prior Publication Data

US 2007/0065973 A1    Mar. 22, 2007

Related U.S. Application Data

(62) Division of application No. 11/166,962, filed on Jun. 23, 2005, now abandoned.

(51) Int. Cl.
*H01L 21/20* (2006.01)
*H01G 9/00* (2006.01)

(52) U.S. Cl. .................. 438/399; 438/381; 438/393; 29/25.03; 257/E21.008

(58) Field of Classification Search .......... 438/399, 438/393, 381, 957, 396; 29/25.03; 257/E21.008
See application file for complete search history.

(56) References Cited

U.S. PATENT DOCUMENTS

| | | | |
|---|---|---|---|
| 3,585,472 A | 6/1971 | Dornfeld | |
| 4,236,046 A | 11/1980 | De Vries | |
| 4,998,159 A | 3/1991 | Shinohara et al. | |
| 5,126,801 A | 6/1992 | Nishino et al. | |
| 5,256,597 A | 10/1993 | Gambino | |
| 5,387,888 A | 2/1995 | Eda et al. | |
| 5,612,512 A | 3/1997 | Wakamatsu et al. | |
| 5,930,639 A | 7/1999 | Schuele et al. | |
| 5,970,362 A | 10/1999 | Lyons et al. | |
| 6,005,197 A | 12/1999 | Kola et al. | |
| 6,165,814 A | 12/2000 | Wark et al. | |
| 6,218,729 B1 | 4/2001 | Zavrel, Jr. et al. | |
| 6,252,178 B1 | 6/2001 | Hashemi | |

(Continued)

FOREIGN PATENT DOCUMENTS

EP    03/178112    2/1991

(Continued)

OTHER PUBLICATIONS

Yongki, Min et al., U.S. Appl. No. 11/092,357, entitled "Capacitor with Co-planar Electrodes", filed Mar. 29, 2005.

(Continued)

*Primary Examiner*—Alexander G Ghyka
*Assistant Examiner*—Seahvosh J Nikmanesh
(74) *Attorney, Agent, or Firm*—Blakely, Sokoloff, Taylor & Zafman LLP

(57) ABSTRACT

An embedded passive structure, its method of formation, and its integration onto a substrate during fabrication are disclosed. In one embodiment, the embedded passive structure is a thin film capacitor (TFC) formed using a thin film laminate that has been mounted onto a substrate. The TFC's capacitor dielectric and/or lower electrode layers are patterned in such a way as to reduce damage and improve cycle time. In one embodiment, the capacitor dielectric has a high dielectric constant and the substrate is an organic packaging substrate.

13 Claims, 5 Drawing Sheets

U.S. PATENT DOCUMENTS

| | | |
|---|---|---|
| 6,277,436 B1 | 8/2001 | Stauf et al. |
| 6,331,442 B1 * | 12/2001 | New .............................. 438/3 |
| 6,346,743 B1 | 2/2002 | Figueroa et al. |
| 6,400,576 B1 | 6/2002 | Davidson |
| 6,407,929 B1 | 6/2002 | Hale et al. |
| 6,477,034 B1 | 11/2002 | Chakravorty et al. |
| 6,507,496 B2 | 1/2003 | Levy et al. |
| 6,519,136 B1 | 2/2003 | Chu et al. |
| 6,524,905 B2 | 2/2003 | Yamamichi et al. |
| 6,565,730 B2 | 5/2003 | Chakravorty et al. |
| 6,568,073 B1 | 5/2003 | Fukutomi et al. |
| 6,582,979 B2 | 6/2003 | Coccioli et al. |
| 6,590,227 B2 | 7/2003 | Ishikawa |
| 6,611,419 B1 | 8/2003 | Chakravorty |
| 6,677,630 B1 | 1/2004 | Kanaya et al. |
| 6,678,144 B2 | 1/2004 | Higashi et al. |
| 6,714,422 B2 | 3/2004 | Okubora et al. |
| 6,724,611 B1 | 4/2004 | Mosley |
| 6,787,902 B1 | 9/2004 | Survakumar |
| 6,803,324 B2 | 10/2004 | Ogawa et al. |
| 6,818,469 B2 | 11/2004 | Mori et al. |
| 6,822,170 B2 | 11/2004 | Takeuchi et al. |
| 6,841,861 B2 | 1/2005 | Brady |
| 6,847,527 B2 | 1/2005 | Sylvester et al. |
| 6,889,431 B2 | 5/2005 | Okabe et al. |
| 6,890,810 B2 | 5/2005 | Amadon et al. |
| 6,900,708 B2 * | 5/2005 | White et al. ................. 333/185 |
| 6,917,259 B2 | 7/2005 | Hirabayashi |
| 6,970,362 B1 | 11/2005 | Chakravorty |
| 7,290,315 B2 | 11/2007 | Palanduz et al. |
| 7,435,675 B2 | 10/2008 | Seh et al. |
| 7,541,265 B2 * | 6/2009 | Das et al. .................... 438/528 |
| 7,588,992 B2 | 9/2009 | Min |
| 2001/0019144 A1 | 9/2001 | Roy |
| 2002/0070400 A1 | 6/2002 | Shibuya et al. |
| 2002/0185303 A1 | 12/2002 | Takeuchi et al. |
| 2004/0087058 A1 | 5/2004 | Ooi et al. |
| 2004/0104451 A1 | 6/2004 | Ooi et al. |
| 2004/0110319 A1 | 6/2004 | Fukutomi et al. |
| 2004/0231885 A1 | 11/2004 | Borland et al. |
| 2005/0161833 A1 | 7/2005 | Takeuchi et al. |
| 2005/0230800 A1 | 10/2005 | Do et al. |
| 2006/0000542 A1 | 1/2006 | Min et al. |
| 2006/0043567 A1 * | 3/2006 | Palanduz .................... 257/697 |
| 2006/0091494 A1 | 5/2006 | Miyamoto et al. |
| 2006/0091495 A1 | 5/2006 | Palanduz et al. |
| 2006/0099803 A1 | 5/2006 | Min |
| 2006/0158368 A1 | 7/2006 | Walter et al. |
| 2006/0220167 A1 | 10/2006 | Min et al. |
| 2006/0228855 A1 | 10/2006 | Min et al. |
| 2006/0281278 A1 | 12/2006 | Min |

FOREIGN PATENT DOCUMENTS

| | | |
|---|---|---|
| JP | 2002305125 | 10/2002 |

OTHER PUBLICATIONS

Yongki, Min et al., U.S. Appl. No. 10/882,745, entitled "Metal Oxide Ceramic Thin Film on Base Metal Electrode", filed Jun. 30, 2004.

Palanduz, Cengiz A. et al., U.S. Appl. No. 10/976,425, entitled "Redox Control of Adhesion Layer of Thin Film Capacitor", filed Oct. 29, 2004.

Palanduz, Cengiz A. et al., U.S. Appl. No. 10/971,829, entitled "Passive Device Structure", filed Oct. 21, 2004.

Yongki, Min, U.S. Appl. No. 10/974,139, entitled "Thin Film Capacitor", filed Oct. 26, 2004.

Yongki, Min et al., U.S. Appl. No. 11/095,690, entitled "IC Package with Prefabricated Film Capacitor", filed Mar. 31, 2005.

Min, Yongki, U.S. Appl. No. 11/152,328, entitled, "Integrated thin-film capacitor with etch-stop layer, process of making same, and packages containing same", filed Jul. 14, 2005.

Office Action for U.S. Appl. No. 11/166,962, Mailed Jan. 17, 2007, Whole Document.

Final Office Action for U.S. Appl. No. 11/166,962, Mailed Jun. 22, 2007, Whole Document.

Office Action for U.S. Appl. No. 11/166,962, Mailed Nov. 7, 2007, Whole Document.

Final Office Action for U.S. Appl. No. 11/166,962, Mailed Apr. 29, 2008, Whole Document.

Office Action for U.S. Appl. No. 11/152,328, Mailed Nov. 26, 2007, Whole Document.

Office Action for U.S. Appl. No. 11/152,328, Mailed Aug. 6, 2008, Whole Document.

Notice of Allowance for U.S. Appl. No. 11/152,328, Mailed May 8, 2009, Whole Document.

Office Action for U.S. Appl. No. 11/095,690, Mailed Mar. 16, 2007, Whole Document.

Office Action for U.S. Appl. No. 11/095,690, Mailed Jul. 27, 2007, Whole Document.

Office Action for U.S. Appl. No. 11/095,690, Mailed Jan. 16, 2008, Whole Document.

Final Office Action for U.S. Appl. No. 11/095,690, Mailed Jun. 30, 2008, Whole Document.

PCT, "International Preliminay Report on Patentability (IPRP Chapter I) Mailed Jan. 18, 2007", PCT/US2005/022356, Whole Document.

PCT, "International Search Report dated May 8, 2006", PCT/US2005/037626, Whole Document.

PCT, "International Preliminary Report on Patentability (IPRP Chapter I) Mailed May 3, 2007", PCT/US2005/037626, Whole Document.

PCT, "International Search Report dated Aug. 1, 2006", PCT/US2006/012587, Whole Document.

PCT, "International Preliminary Report on Patentability (IPRP Chapter I) Mailed Oct. 11, 2007", PCT/US2006/012587, Whole Document.

* cited by examiner

PRE-PATTERNED THIN FILM CAPACITOR AND METHOD FOR EMBEDDING SAME IN A PACKAGE SUBSTRATE

This is a Divisional Application of Ser. No. 11/166,962 filed Jun. 23, 2005 now abandoned, which is presently pending.

FIELD OF THE INVENTION

Embodiments of the present invention relate generally to semiconductor technology and more specifically to semiconductor packaging.

BACKGROUND OF THE INVENTION

The demand for increased mobility in consumer electronics is pressuring manufacturers to scale electronic technologies (e.g., semiconductor devices) to ever smaller dimensions. At the same time, the demand for increased functionality, speed, noise elimination, etc., is forcing manufactures to increase the number of passive components (e.g., capacitors and resistors) used by consumer electronic devices. Passive component integration has traditionally been accomplished by mounting them onto package and/or printed circuit board (PCB) substrate surfaces. Restricting the location of the passive components to the substrate's surface however can limit the passive components' operational capabilities (due to their inherent distance from the semiconductor device) and the substrate's scalability.

One way manufacturers are attempting to address this is by embedding the passive components in the substrate, a technique referred to as embedded passive technology. This frees up surface real estate and facilitates substrate miniaturization. Speed and signal integrity also improves because embedded components provide a more direct path through which the IC signals propagate.

One particular area of interest with respect to embedded passive technology has been the incorporation of thin film capacitors (TFCs) into organic packaging (e.g., bismaleimide triazine resin, etc.) substrates. Among the various materials being considered for use as capacitor dielectrics are high-k ceramic materials. However, high-k ceramic materials can require processing at high temperatures (e.g., furnace annealing at 600-800 degrees Celsius) in order to achieve their high dielectric constant properties. At these temperatures, organic packaging substrates can melt.

One technique for addressing this involves mounting a pre-fabricated TFC laminate that has already been annealed onto the organic substrate. Shown in FIG. 1 is an example illustration of such a TFC laminate 102, which includes a high-k ceramic material 108 superimposed between conductive films 106 and 104. In FIG. 2, the conductive film 106 portion of the TFC laminate 102 has been patterned to define lower electrode structures 110. In FIG. 3 the partially patterned TFC 102 is then mounted to a substrate 118 that includes polymer build-up layers 111, 114 and copper build-up layer 112. The copper build-up layer 112 connects with underlying conductive structures (not shown) by way of via portions 113. Next, as shown in FIG. 4, the conductive film 104 is thinned and patterned to form upper electrode portions 121. Then, as shown in FIG. 5, via openings 122 are formed thru the high-k ceramic material, the polymer build-up layer 111, and in some cases, portions of the lower electrode structures 110, to expose underlying portions of copper build-up layer 112. Finally, as shown in FIG. 6, a conductive material is deposited in the vias and over the surface of the TFC where it is then thinned and patterned to form upper electrodes 126, biasing interconnects 128 for the lower electrodes, I/O interconnects 130, build-up interconnect structures, and/or the like.

The use of this integration scheme however is not without its problems. More specifically, any one of the processes used to pattern the lower electrodes 110, the upper electrode portions 121, and/or the via openings 122 can damage the hi-k ceramic dielectric 108 and thereby impact the functionality of the TFC.

Figure 1:
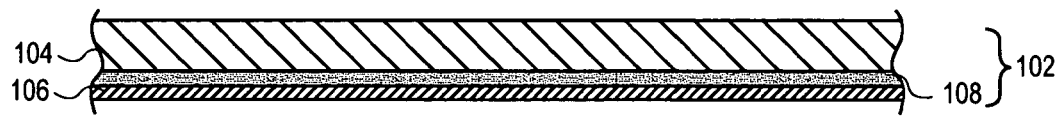
FIGS. 1-6 illustrate cross-sectional views showing formation of an embedded passive component in an organic substrate using conventional methods.
Figure 2:
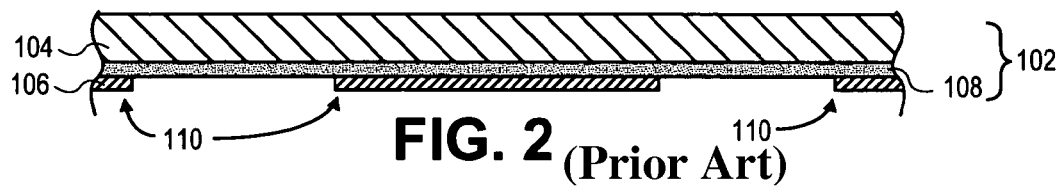
Figure 3:
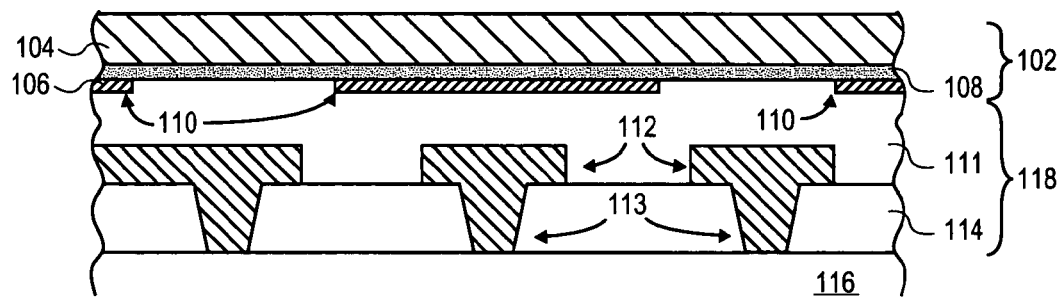

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, an embedded passive structure and its method of formation are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a thin film laminate for use in the fabrication of embedded passives and its method of formation are disclosed. In one embodiment, the formation of embedded passive structures using a prepared thin film laminate mounted on a substrate is disclosed. Aspects of these and other embodiments will be discussed herein with respect to FIGS. 7-17, below. The figures, however, should not be taken to be limiting, as they are intended for the purpose of explanation and understanding.

Shown in FIGS. 7-11 are steps illustrating the formation of a thin film laminate that can be used to form embedded passive components, such as for example, thin film capacitors (TFCs) for use inside a packaging substrate, a PCB substrate, or the like. More specifically, FIGS. 7-11 illustrate formation of TFC laminate in such a way as to pre-pattern the laminate's capacitor dielectric and/or the capacitor electrodes so as to have a specific orientation prior to mounting the TFC laminate onto the substrate's surface. The term "substrate" as used herein, is intended to encompass any type of packaging substrate, PCB substrate, etc., which can be used to accommodate embedded passive components.

Figure 7:
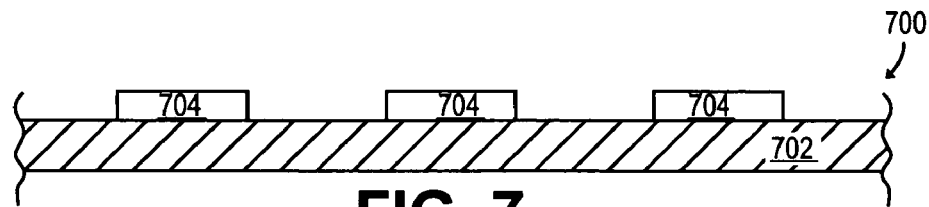
FIGS. 7-17 illustrate cross-sectional views showing formation of an embedded passive component in an organic substrate using an embodiment of the present invention.
Figure 9:
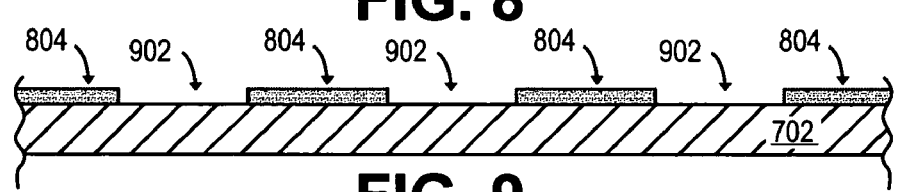

In FIG. 7, a cross-sectional view of patterned resist members 704 overlying a thin film conductive material 702 is shown (base layer). The patterned resist members 704 can be formed using conventional lithographic processes. The resist is patterned in such a way that exposed regions of underlying conductive material 702 correspond with the pattern of a subsequently defined capacitor dielectric (FIG. 9).

The conductive film 702 will subsequently be used to form a TFC capacitor electrode layer. The conductive film 702 is also used as the base material for forming the TFC's capacitor dielectric and opposing capacitor electrodes (not shown in FIG. 7). Conductive film 702 can be a free standing conductive layer or alternatively it can be supported by other layers, materials or structures. Typically, the conductive film 702 includes metal materials, such as copper, nickel, or the like. Typically, the conductive film 702 is metal foil layer having a thickness of 50-300 microns. In one non-limiting embodiment the conductive film 702 is a nickel foil material having a thickness of approximately 100 microns. At this thickness, the metal foil itself can function as a foundation for the deposition and patterning of subsequent capacitor dielectric and capacitor electrode layers.

Figure 8:
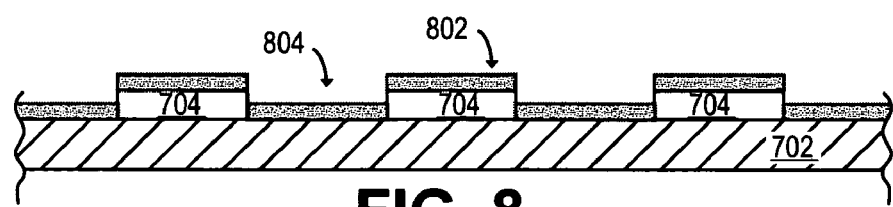

Turning now to FIG. 8, a cross-sectional view of the structure shown in FIG. 7 is illustrated following formation of a dielectric film 802, 804 over the resist members 704 and over the conductive film 702. The dielectric film portions 802 and 804 are deposited contemporaneously. The raised portions 802 of the dielectric film (i.e. portions overlying the resist members 704) are temporary and will subsequently be removed. The recessed portions 804 of the dielectric film (i.e., portions overlying the conductive film 702) are permanent and will subsequently be used to form the TFC's capacitor dielectric.

Any number of materials can be used to form the dielectric film 804, 802. For example, it can include high dielectric constant (high-k) materials such as barium titinate ($BaTiO_3$), strontium titinate ($SrTiO_3$), barium strontium titinate ($BaSrTiO_3$), or the like. For the purposes of this specification and as used by one of ordinary skill, barium titinate and barium strontium titinate are commonly also referred to as BT and BST, respectively. The dielectric film 804, 802 can be deposited using conventional physical vapor deposition (PVD)(i.e., evaporation, sputtering, etc.), chemical vapor deposition, spin-on processes, laser ablation, ion plating, plasma spray processes, or the like. In one embodiment, the dielectric 804, 802 is a sputtered ceramic dielectric material. In one embodiment the dielectric 804,802 is a sputtered BST layer having a thickness in a range of approximately 0.1 microns to approximately 1.0 microns and deposited at a temperature less than approximately 200 degrees Celsius.

Turning now to FIG. 9, a cross-sectional view of the structure of FIG. 8 is shown after removal of resist members 704 and raised portions 802 of the capacitor dielectric film. The remaining structures 804 define a patterned capacitor dielectric layer. In accordance with one embodiment, the open regions 902 provide locations where subsequently formed vias can be positioned. The resist members 704 and raised portions 802 can be removed using a conventional resist lift-off method, for instance, using an organic solvent based resist remover such as acetone, an oxygen plasma, combinations thereof, or the like. The use of such lift-off methods is considered conventional to one of ordinary skill.

Figure 10:
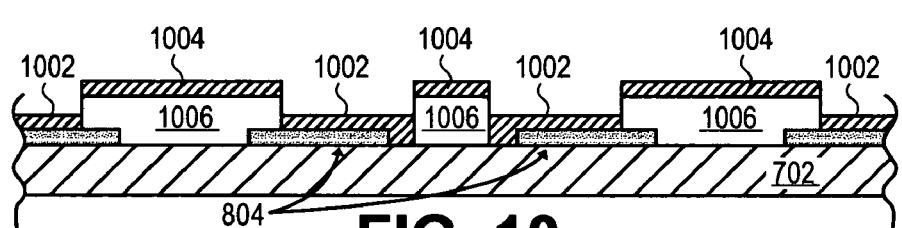

Turning now to FIG. 10, a cross-sectional view of the structure of FIG. 9 is illustrated following formation of patterned resist members 1006 and conductive film 1002, 1004 over the substrate. Like the portions 802 of the capacitor dielectric layer in FIG. 8, those portions 1004 of the conductive film that are formed over the resist members 1006 are subsequently removed. Remaining conductive film portions 1002 define a patterned layer of first (lower) capacitor electrodes for the TFC. The resist members can be formed using conventional resist patterning processes. The conductive film 1002, 1004 can be deposited using a PVD process, combination PVD and electroplating or electroless plating processes, or the like. The conductive film 1002, 1004 can include materials such as copper, nickel, platinum, and the like. The conductive film 1002, 1004 typically has a thickness in a range 5-40 microns. In one embodiment, the conductive film 1002, 1004 is copper, has a thickness in a range of approximately 10-20 microns, and is deposited using a combination of conventional sputter deposition and electroplating processes.

Figure 11:
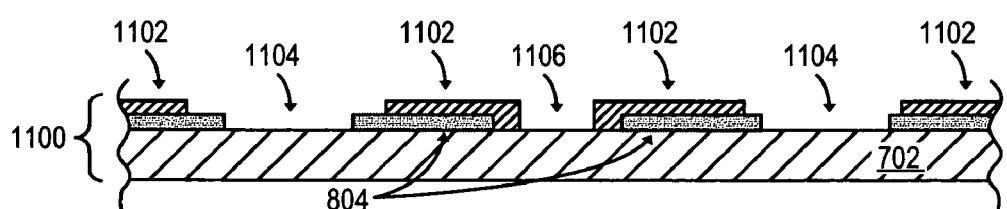

Next, as shown in FIG. 11, the resist members 1006 and conductive material portions 1004 are removed. The removal forms openings 1104, 1106, and defines patterned conductive regions 1102. The patterned conductive regions 1102 overlie portions of the capacitor dielectric 804 and the conductive film 702. Here, the patterned conductive regions 1102 define lower electrodes in the TFC laminate that have a specific orientation that facilitates formation of TFC structures on substrates. In one embodiment, the orientation is such that it accommodates the placement of vias during the formation of a conductive build-up layer on a packaging substrate. The resist members 1006 and conductive material 1004 can be removed using a conventional resist lift-off process, for instance using an organic solvent based resist remover such as acetone, an oxygen plasma, combinations thereof, or the like.

In accordance with one embodiment, the combination of the conductive film 702, the patterned capacitor dielectric 804, and the patterned conductive regions 1102 forms a prefabricated, pre-patterned lower electrode and capacitor dielectric TFC laminate 1100 that can be used to define embedded passive structures over a substrate. To the extent that the TFC laminate 1100 includes a high-k ceramic dielectric layer such as BST, BT, or the like, it can now be annealed at a temperature, for instance, in a range of approximately 500-900 degrees Celsius in order to adjust the dielectric constant accordingly. Alternatively, the annealing can take place at an earlier stage of the TFC fabrication process, for example prior to formation of resist members 1006.

Figure 12:
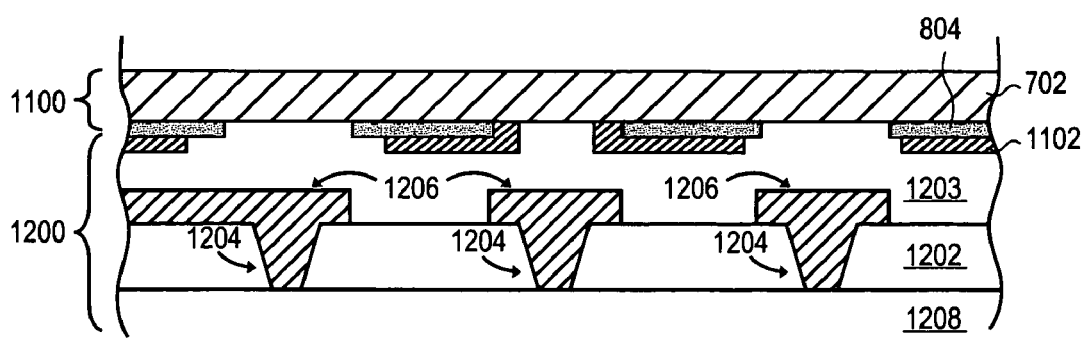

Turning now to FIG. 12, the TFC laminate 1100 is next mounted to a substrate 1200. Typically the TFC laminate 1100 is mounted so that the patterned conductive regions (lower electrode) 1102 contact the substrate 1200 as shown in FIG. 12. In one embodiment, as here, the substrate 1200 is a packaging substrate, but one of ordinary skill appreciates that other substrates types, for example PCB substrates could equally incorporate one or more of the embodiments herein.

The substrate 1200 shown here includes polymer build-up layers 1202 and 1203 and a conductive build-up layer that includes interconnects 1206 and vias 1204. Polymer build-up layers can be formed, for example, using a dielectric material, such as an Ajinomoto Build-Up Film (ABF). Interconnects/vias can be formed, for example, using copper. The use and formation of build-up layers is known to one of ordinary skill. Underlying the vias 1204 and build-up dielectric film 1202 includes layer(s) 1208. Typically, layer(s) 1208 includes an organic core material as known to one of ordinary skill and/or additional dielectric and conductive build-up layers.

To improve adhesion between the TFC laminate 1100 and the substrate 1200, the TFC laminate 1100 and substrate can be joined after roughening the conductive regions 1102 and prior to curing the build-up layer 1203. The conductive region 1102 can be roughened using chemical etching, sputter etching, and/or the like processes. One of ordinary skill appreciates that the fragile nature of the TFC laminate 1100 and its relative alignment to the underlying substrate 1200 can be important considerations with respect to mounting the TFC 1100 onto the substrate 1200.

Figure 13:
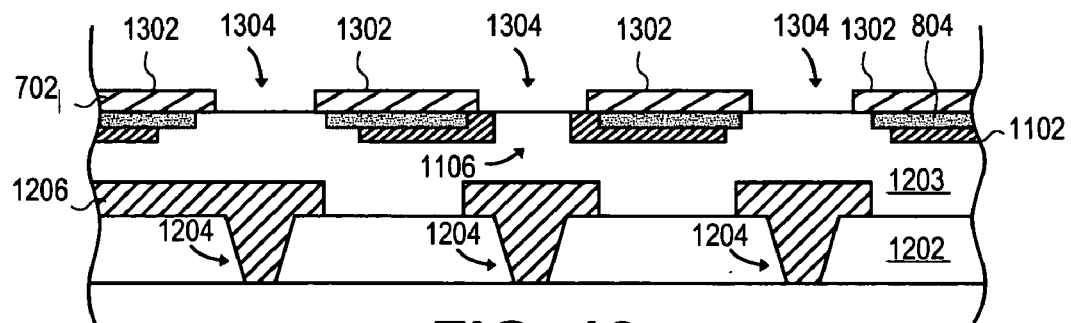

Next, referring to FIG. 13, the conductive film 702 is thinned and then patterned to partially form the upper electrode layer structures 1302. Thinning can be accomplished using, for instance, a wet etch process, a dry etch process, a polishing process, combinations thereof, or the like. To the extent that the conductive film 702 is nickel, thinning can be accomplished by etching it with a wet etchant, such as ferric chloride ($FeCl_3$) prior to patterning. In one embodiment, the conductive film 702 is thinned to between approximately 10-20 microns.

Thinning facilitates patterning of upper electrode layer structures 1302 by reducing the amount of conductive material that must be removed. Thinning at this point in the processes may be advantageous because during earlier stages of TFC laminate 1100 fabrication, the thicker conductive film is stronger and less susceptible to physical/chemical damage during formation of the patterned capacitor dielectric and patterned lower electrode structures.

Figure 4:
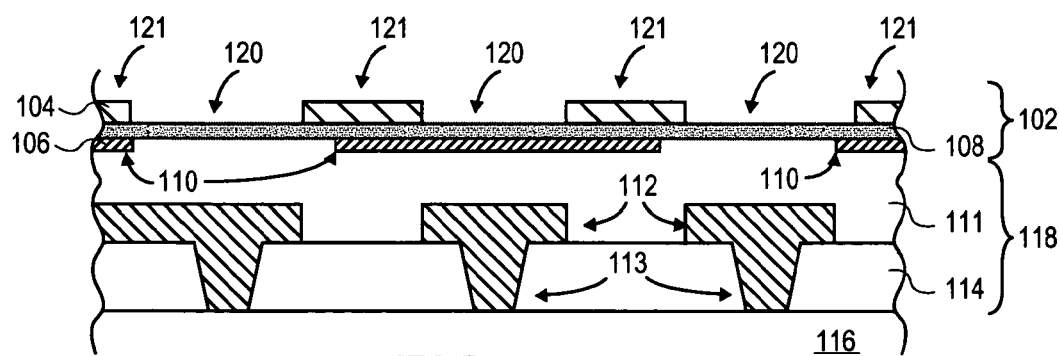

After thinning, the conductive film 702 is patterned with resist and then etched to define the partially formed upper electrode layer structures 1302. Etching can be accomplished using wet or dry etch processes. In one embodiment, the partially formed upper electrode layer structures 1302 are etched using a ferric chloride solution. As can be seen in FIG. 13, unlike conventional TFC processing which exposes portions of the capacitor dielectric to a potentially damaging etch process while defining the partially formed electrodes (FIG. 4), here the problem can been overcome by selectively limiting the formation of openings 1304 to pre-patterned regions where there is no capacitor dielectric to damage.

Figure 14:
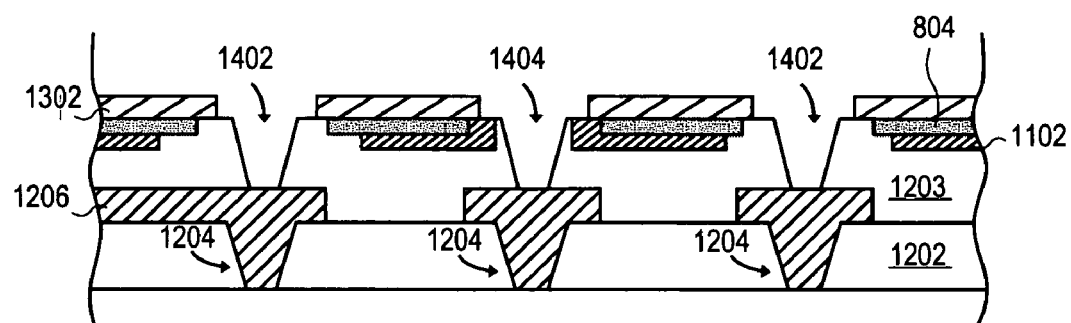

Next, shown in FIG. 14, the substrate is patterned to define via openings 1402 that extend through polymer build-up layer 1203 and expose portions of the underlying conductive interconnect structures 1206. The vias can be patterned using, for instance, a laser drilling process, a conventional photolithography/etch patterning process, or the like. In one embodiment, patterning is accomplished using a $CO_2$ laser or the like.

Figure 5:
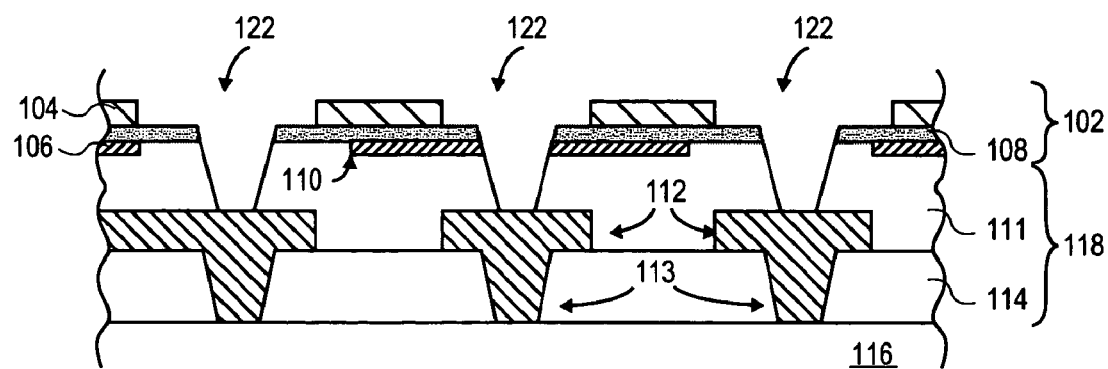
Figure 6:
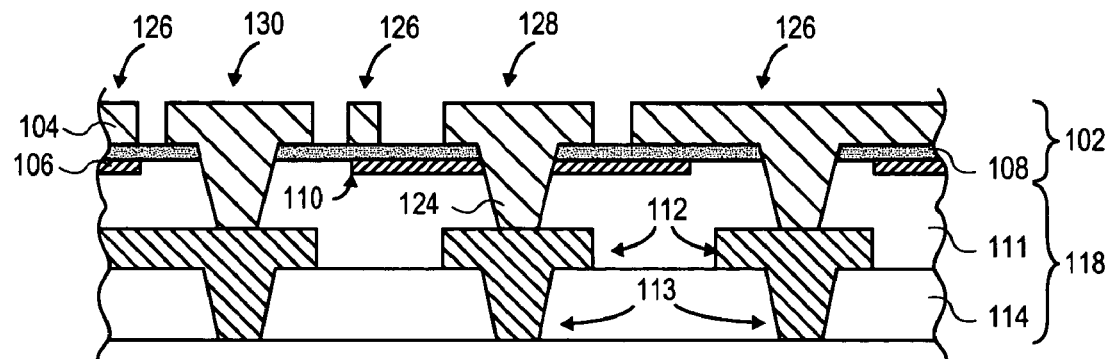

As can be seen in FIG. 14, unlike conventional TFC processing which exposes portions of the capacitor dielectric to a potentially damaging laser drilling or etch process while forming the via openings (FIG. 5), here the problem has been overcome by selectively limiting the formation of the via openings 1402, 1404 to the pre-patterned regions where there is no capacitor dielectric to damage. That is, problems associated with damaging the capacitor dielectric during the process of defining via openings 1402, 1404 are significantly reduced because the capacitor dielectric has been strategically removed from regions that can be exposed to etchants and/or the laser via drilling process. In addition, because there is no ceramic dielectric layer portions that have to be removed during the formation of the via openings, conventional etch processes and/or lower power lasers (as opposed to the more expensive high-power laser drilling processes) can be used to form the via openings.

In addition, because the lower electrode layer 1102 has also been pre-patterned and conductive material removed from regions where via 1404 is to be formed, laser drilling process and/or etch rate and etch uniformity during formation of the via opening can be improved. That is, by removing regions of lower electrode layer 1102 from locations where via 1404 is to be formed, the type of material(s) which must be removed to form the via openings is more consistent from via-to-via across the substrate. This has the potential to reduce the amount of damage to underlying structures by reducing their overall time of exposure to the process that forms the via openings (i.e. overetch time can be reduced). In addition, it can also improve cycle time because obstructions (i.e., the portions of the lower electrode) which can impede the etch or laser ablation process have been removed.

Figure 15:
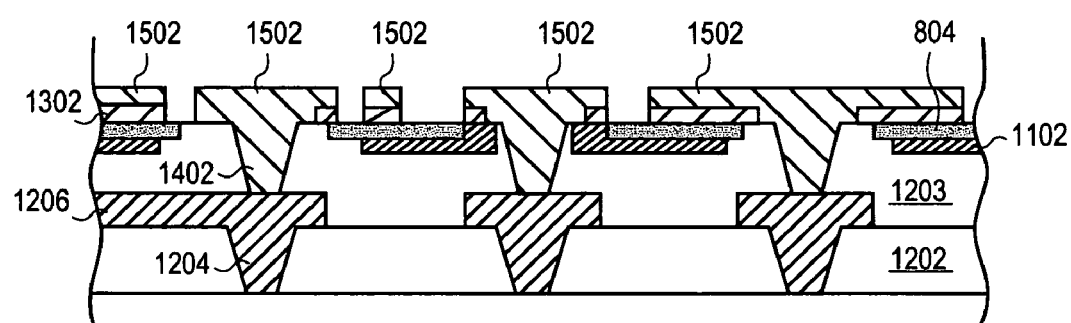
Figure 16:
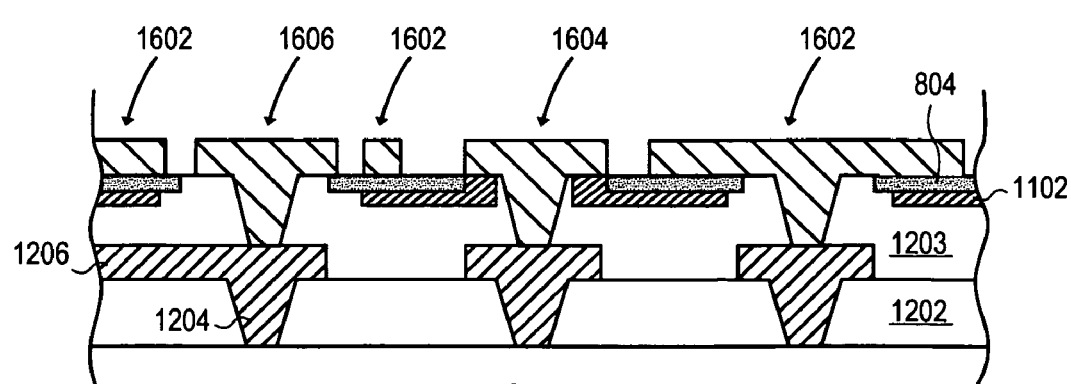
Figure 17:
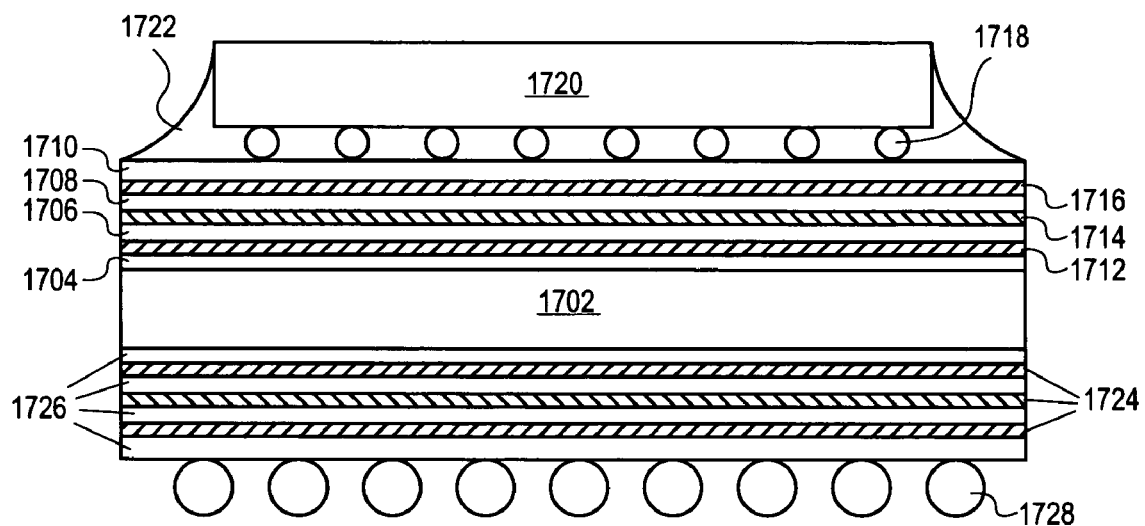

Next, referring to FIGS. 15 and 16, a conductive material 1502 has been deposited in via openings 1404. This can be accomplished using a conventional electroplating, electroless plating, PVD process, or the like. Suitable materials for forming conductive fill material 1502 include copper, aluminum, or the like. In one embodiment the conductive material includes copper. In one embodiment, the conductive fill material is deposited by first globally depositing a seed layer of copper (e.g., a layer of copper having a thickness less than approximately one micron) using an electroless plating or PVD process followed by deposition of a full thickness copper material using an electroplating process. As shown in FIG. 15, the deposition typically also deposits conductive material 1502 over the surface of the partially formed upper electrode layer structures 1302. After the conductive material 1502 completely fills the via openings 1402 and adequately covers the surface of the substrate, the combination stack of conductive material 1502 overlying the partially formed upper electrode layer structures 1302 is then thinned and patterned to define the completely formed upper electrode and associated structures (upper conductive structures). Thinning can be accomplished using, for instance, a wet chemical etch process, a dry etch processes, a chemical mechanical polishing processes, and/or the like. Patterning can be accomplished using a conventional lithographic and etch patterning process, a lift-off process, or the like.

For the purpose of simplicity of illustration of understanding, the structure of FIG. 15 has been redrawn in FIG. 16 to show the combination stack of conductive material 1502 and partially defined upper electrode layer structures 1302 as unitary conductive structures 1602, 1604, and 1606. As can be seen in FIG. 16, the unitary conductive structures defined by the combination of conductive material 1505 and partially defined upper electrode layer structures 1302 form an I/O interconnect structure 1606, an interconnect structure 1604 that is coupled to a lower capacitor electrode, and an interconnect structure 1602 that is coupled to an upper capacitor electrode. One of ordinary skill appreciates that other integration schemes for forming the upper conductive structures could also include, for example, complete removal of the upper conductive film 702 (instead of thinning and patterning to form partially defined upper electrode layer structures 1302) followed by a seed layer deposition, the full thickness conductive layer deposition, and pattering to define the conductive structures 1602, 1604, 1606.

Embodiments of the present invention are not necessarily limited to only the formation of structures such as 1602, 1604, and 1606. Any number of other interconnect features associated with the formation of build-up layer technology can be accommodated using one or more of the integration schemes disclosed herein. In other words, using one or more of the embodiments disclosed herein, any one of the conductive structures 1602, 1604, 1606 can be incorporated into processes used to form conductive build-up layer interconnects. So for example, in those regions of the TFC laminate corresponding to regions where only conductive build-up layer interconnects and/or vias are to be formed, pre-patterning processes can be used to remove capacitor dielectric and lower electrode layer materials. And then, after the laminate is mounted, portions of conductive film 702 can be cleared away from interconnect and/or via regions during the etch process to form the openings 1304 (FIG. 13). In this way, one or more of the embodiments disclosed herein can be seamlessly integrated into existing build-up layer technology process flows.

Subsequent processing is considered conventional to one of ordinary skill. So, for example, referring to FIG. 17, which shows the relative positional relationships of conductive build-up layers 1712, 1714, 1716, 1724, polymer build-up layers 1704, 1706, 1708, 1710, 1726, an organic core material 1702, a semiconductor die 1720, underfill material/fillets 1722, die-to-package interconnects 1718, and package-to-PCB interconnects 1728, if TFC structures similar to one or more of those disclosed in FIGS. 7-16 were incorporated into, for instance, the conductive build-up layer 1714 (TFC structures not shown), then additional conductive build up layer 1716 and polymer build-up layers 1708 and 1710 could additionally be formed overlying them using conventional methods. Following the formation of the desired number of build-up layers, the semiconductor die can be attached to the package substrate using conventional die attach reflow methods, bump interconnects 1728 could be attached to the package substrate using conventional methods (e.g. ball grid array (BGA) reflow methods), and then the integrated package that includes the passive TFCs could be mounted to a PCB, a mother board, or the like, for use by the electronic device.

In at least one of the embodiments disclosed herein, a TFC laminate's capacitor dielectric and its method of formation are disclosed. The capacitor dielectric is pre-patterned in such a way that makes it less susceptible to damage from etch and/or laser ablation processes used to define the capacitor structure. In an alternative embodiment, a TFC laminate's capacitor electrode and its method of formation are disclosed. The capacitor electrode is pre-patterned in such as way that improves etch/laser ablation uniformity during processes used to form via openings. In an alternative embodiment, the integration of a TFC laminate having pre-patterned capacitor dielectric structures and/or pre-patterned electrode layer structures onto a substrate is disclosed. In an alternative embodiment, the formation of thin film capacitors in build-up layers of a packaging substrate is disclosed The various embodiments described above have been presented by way of example and not by way of limitation. Thus, for example, while embodiments disclosed herein teach the formation of embedded capacitors in build-up layer of a packaging substrate. Other passive structures, such as for example inductors, resistors, etc., can similarly be formed and/or accommodated using one or more of the embodiments disclosed herein. Also, these passive components can be formed in any number of substrate types that can accommodate the incorporation TFC laminates.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for forming embedded passive structures in an organic packaging substrate comprising:
    affixing an embedded passive laminate on the organic packaging substrate, wherein the embedded passive laminate being affixed includes a pre-patterned capacitor dielectric layer having a first opening, and wherein a conductive layer of the affixed embedded passive laminate covers the first opening; and
    after the affixing,
        removing a portion of the conductive layer to expose the first opening, and
        forming a via opening through the exposed first opening to the organic packaging substrate.

2. The method of claim 1, wherein the pre-patterned capacitor dielectric layer is further characterized as a ceramic dielectric material.

3. The method of claim 2, wherein the ceramic dielectric material is further characterized as being selected from a group consisting of strontium titinate, barium strontium titinate, and/or barium titinate.

4. The method of claim 3, wherein the substrate is further characterized as an organic substrate.

5. A method for forming an embedded thin film capacitor comprising:
    forming a thin film capacitor laminate, including
        depositing a ceramic dielectric layer over a base layer of conductive material,
        patterning the ceramic dielectric layer to form first openings to portions of the base layer,
        depositing a lower electrode layer over the ceramic dielectric layer, and
        patterning the lower electrode layer to form second openings to portions of the base layer,
    the formed thin film capacitor laminate having a combination of the base layer, the patterned ceramic dielectric layer, and the patterned lower electrode layer;
    mounting the formed thin film capacitor laminate over a second dielectric layer on a substrate, wherein the patterned lower electrode layer is positioned between the base layer and the second dielectric layer; and
    removing a portion of the base layer from the mounted thin film capacitor laminate to expose one of the formed first openings;
    forming on the mounted thin film capacitor laminate a via opening through the exposed one of the first openings to one of the formed second openings, the formed via opening extending through the second dielectric layer to an underlying conductive structure.

6. The method of claim 5 further comprising heating the ceramic dielectric at a temperature in a range of 500-900 degrees Celsius prior to depositing the lower electrode layer.

7. The method of claim 5, the method further comprising:
    filling the via openings with a conductive material; and
    patterning the conductive material to form a conductive structure.

8. The method of claim 5, wherein the ceramic dielectric layer includes a material selected from a group consisting of strontium titinate, barium strontium titinate, and/or barium titinate.

9. The method of claim 5, wherein the base layer includes at least one of copper and nickel.

10. The method of claim 5, wherein the lower electrode layer includes at least one of copper, platinum, and nickel.

11. The method of claim 5, wherein the first opening is wider than the second opening.

12. The method of claim 5, wherein the second opening is wider than the first opening and wherein the conductive structure electrically couples to portions of the lower electrode layer.

13. The method of claim 5, wherein the conductive structure is further characterized as an upper capacitor electrode.

* * * * *